United States Patent
Letts et al.

(10) Patent No.: US 6,297,796 B1
(45) Date of Patent: Oct. 2, 2001

(54) INK SAVER APPARATUS AND METHOD FOR USE IN A TEST AND MEASUREMENT INSTRUMENT

(75) Inventors: Peter J. Letts; David P. Maguire, both of Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/169,047

(22) Filed: Oct. 8, 1998

(51) Int. Cl.$^7$ .................................................. G09G 5/36
(52) U.S. Cl. .............................................................. 345/134
(58) Field of Search ............................ 73/465; 324/76.11, 324/76.41, 121; 345/134; 347/226; 368/115, 117

(56) References Cited

U.S. PATENT DOCUMENTS

| | | | |
|---|---|---|---|
| 4,127,848 | * 11/1978 | Shanks | 340/324 M |
| 4,468,661 | * 8/1984 | Van Doorn et al. | 340/784 |
| 5,051,776 | * 9/1991 | Mancino | 355/77 |
| 5,162,723 | * 11/1992 | Marzalek et al. | 324/77 B |
| 5,714,878 | * 2/1998 | Saito et al. | 324/121 |

\* cited by examiner

*Primary Examiner*—Almis R. Jankus
*Assistant Examiner*—G. F. Cunningham
(74) *Attorney, Agent, or Firm*—Thomas F. Lenihan

(57) ABSTRACT

An apparatus and method for inverting a color display on a dark background to produce a display on a substantially white background suitable for printing, includes the element of maintaining the same apparent relative intensities in both the LCD display on a dark background and the hardcopy displayed on a light background. The apparatus includes a memory including a first palette for the LCD display, a second palette for the hardcopy display, and a look-up table. A controller accesses the first and second palettes and look-up table for converting display data from LCD data to color-inverted printer data.

5 Claims, 2 Drawing Sheets

INK SAVER APPARATUS AND METHOD FOR USE IN A TEST AND MEASUREMENT INSTRUMENT

FIELD OF THE INVENTION

The subject invention concerns the field of printing from test and measurement instruments in general, and concerns print color inversion in a test and measurement instrument in particular.

BACKGROUND OF THE INVENTION

Modern test and measurement instruments, such as portable oscilloscopes, generally employ LCD (Liquid Crystal Display) screens for displaying acquired waveforms and accompanying text. Some oscilloscopes, such as the TDS 200 oscilloscope manufactured by Tektronix, Inc. of Wilsonville, Oreg., employ an LCD of the type in which the waveform is displayed in one of several colors on a substantially white background. While this arrangement works quite well, some users prefer the waveform to be displayed on a black background (similar to the familiar cathode ray tube (CRT) display). If such a dark background display were to be output to a printer, the amount of ink used by the printer would be unacceptably high. At first, one might think that the solution to this problem is merely to invert the output before sending the file to the printer. This solution would be fine if only text were to be printed. Similarly, some graphics files might be inverted without causing an adverse result, but this is not true for the data representing the screen display of an oscilloscope, as will be explained below.

An oscilloscope displays a waveform as a function of amplitude with respect to time. Such a simplistic version of an oscilloscope display might be capable of color inversion before printing without the loss of information. However, the oscilloscope display also varies in intensity in accordance with how often a trace occurs at the same point on the screen. An oscilloscope having an LCD display operating in this manner is said to be mimicking the decay of illuminated phosphors of a CRT oscilloscope.

Another problem arises because modern oscilloscopes also display each channel in a different color, rather than only in white on black. Thus, the saturation of the particular color serves to indicate how often a particular point of the display has been illuminated within a given time. Selecting dark background colors for the waveform graticule and surrounding menu areas improves waveform display contrast and color separation, but also significantly increase hardcopy cost and printing time.

What is needed is an apparatus and method for inverting the colors of the display for printing, while maintaining the apparent relative intensity information of the display.

SUMMARY OF THE INVENTION

An apparatus and method for inverting a color display on a dark background to produce a display on a substantially white background suitable for printing, includes the element of maintaining the same apparent relative intensities in both the LCD display on a dark background and the hardcopy displayed on a light background. The apparatus includes a memory including a first palette for the LCD display, a second palette for the hardcopy display, and a look-up table, and a controller for accessing the first and second palettes for converting display data between LCD data and color-inverted printer data.

DETAILED DESCRIPTION OF THE INVENTION

LCD-based waveform display generation is an additive color process which displays low intensities as dark areas, and high intensities as bright areas. Such waveforms can be printed out as hardcopy on a printer (a subtractive color device). The printouts exhibit good retention of the relative intensities, but the ink usage caused by printing the dark background is clearly unacceptable. The subject invention addresses this problem by providing an inversion which retains the same apparent relative intensities. A significant amount of engineering time was invested in selecting appropriate colors within the limited set supported by the hardware. A menu for such a system includes an ink saver on/off choice, and a momentary button used for previewing the inksaver mode hardcopy. It should be noted that it is preferable to display the waveform on the LCD in a light on dark format during normal oscilloscope operation to avoid LCD intensity and contrast problem, this explains why the inksaver preview is a momentary selection.

Apparatus according to the subject invention changes dark blue (used in a menu area of the display (not shown)) and black (used in the waveform area of the display (also not shown) to white. To preserve waveform intensity information, the subject apparatus and method attempts to retain the color distance between different waveform pixels, and between waveform pixels and the background. In particular, the subject invention converts almost black color pixels into almost white color pixels with very little saturation. Brighter color pixels are given more saturation. It should be noted that the original saturation value in a hue, saturation, and lightness representation of color is not necessarily retained.

Figure 1:
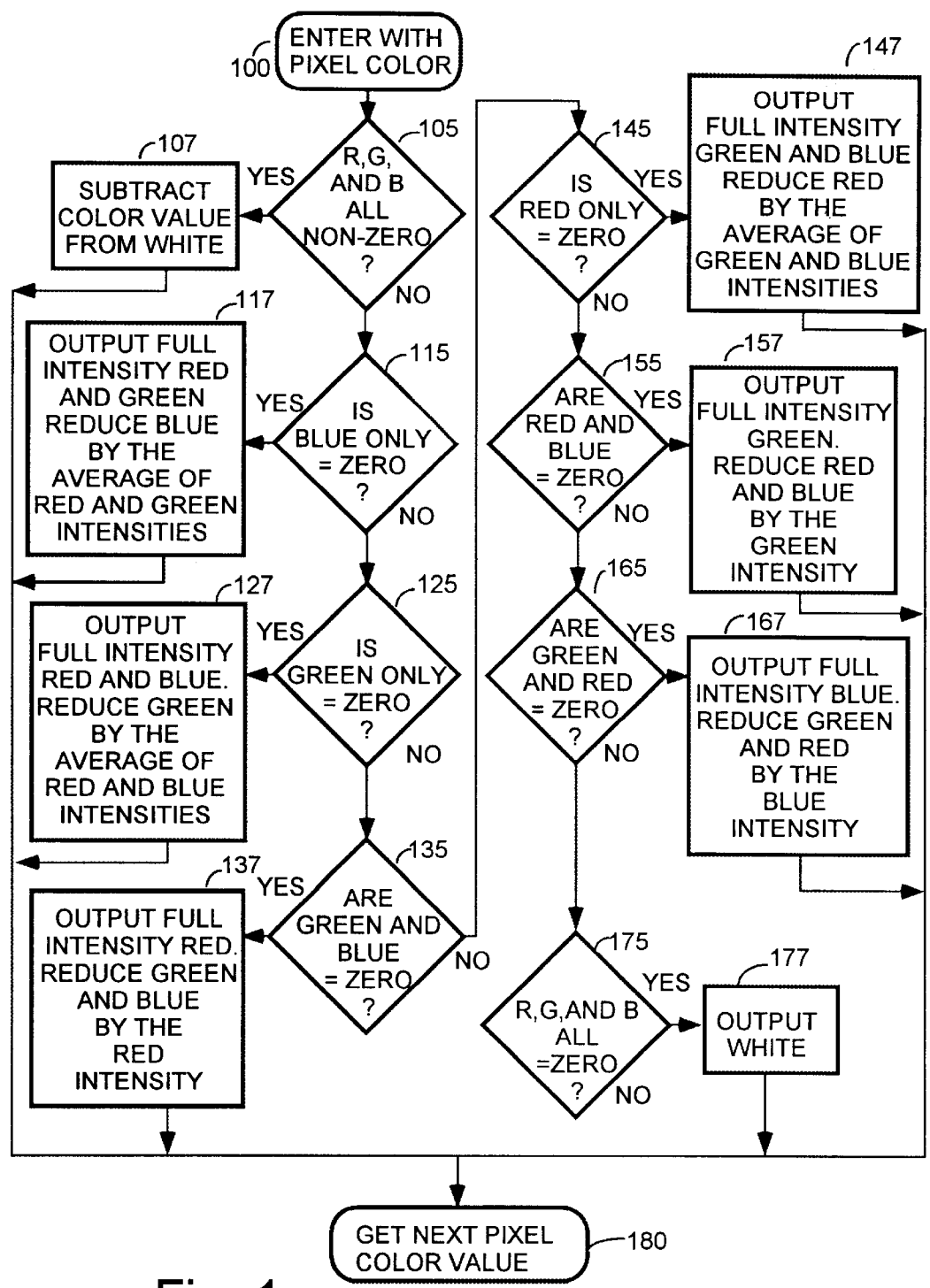
FIG. 1 shows a flowchart useful in understanding the invention.

A simplified flowchart for practicing the invention is shown in FIG. 1. The flowchart of FIG. 1 defines the steps required to convert pixel information from values according to an LCD palette, to values in accordance with a hardcopy palette. It is herein recognized that precomputed values may be stored in a lookup table for fast access, and an instruction such as "reduce blue by the average of red and green intensities" is a direction to access the proper location in the hardcopy palette in accordance with LCD pixel color data.

The routine of FIG. 1 is entered at step 100 with a pixel value to be converted. At step 105, a determination is made as to whether or not all of the data corresponding to red, green, and blue color information relating to that pixel is nonzero. If so, at step 107 the color information is subtracted from values indicative of white, and the routine is exited at step 180.

If, at step 105, one of the color values was equal to zero, then the routine advances to step 115 to see if only the blue portion of the pixel data were equal to zero. If so, then at step 117, the red and green values are adjusted to their full value, and the blue value is reduced by the average of the red and green values. The routine is then exited at step 180.

On the other hand, if at step 115, the blue portion were not zero, or not the only zero value, then the NO path is followed to step 125. At step 125 a check is made to see if only the green portion of the pixel data were equal to zero. . If so, then at step 117, the red and blue values are adjusted to their full value, and the green value is reduced by the average of the red and green values. The routine is then exited at step 180.

On the other hand, if at step 125, the green portion were not zero, or not the only zero value, then the NO path is followed to step 135. At step 135 a check is made to see if both the green portion and the blue portion of the pixel data were equal to zero. If so, the yes path is taken to step 137 wherein an output is generated which is full intensity red, and a value is generated for blue and green which is reduced by the average of the blue and green data. The routine is then exited at step 180.

If at step 135, the green and blue values were not equal to zero, then the NO path is taken to step 145. At step 145 a check is made to see if only the red portion of the pixel data were equal to zero. If so, then at step 147, the green and blue values are adjusted to their full value, and the red value is reduced by the average of the blue and green values. The routine is then exited at step 180.

If at step 145, the red value were not equal to zero, then the NO path is taken to step 155. At step 155 a check is made to see if both the red and blue portions of the pixel data were equal to zero. If so, then at step 157, the green value is adjusted to its full value, and the red and blue values are reduced by the green intensity value. The routine is then exited at step 180.

If at step 155, the red and blue values were not equal to zero, then the NO path is taken to step 165. At step 165 a check is made to see if both the red and green portions of the pixel data were equal to zero. If so, then at step 167, the blue value is adjusted to its full value, and the red and green values are reduced by the blue intensity value. The routine is then exited at step 180.

If at step 165, the red and green values were not equal to zero, then the NO path is taken to step 175. At step 175 a check is made to see if all the red, green, and blue portions of the pixel data were equal to zero. If so, then at step 177, the color white is output. The routine is then exited at step 180.

If at step 175, any of the red, green, and blue values were not equal to zero, then the NO path is taken to the exit at step 180.

Figure 2:
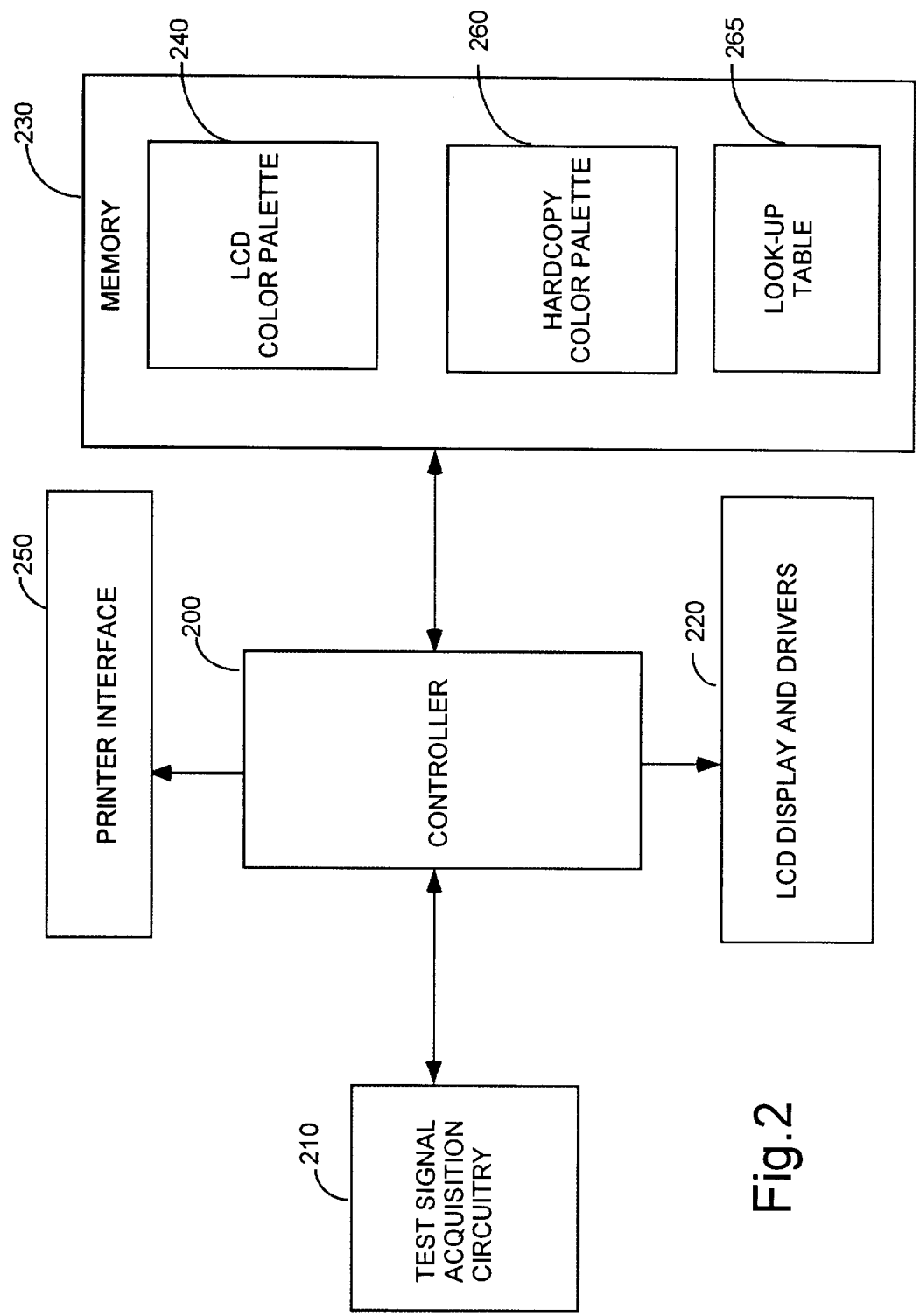
FIG. 2 shows, in block diagram form, apparatus in accordance with the invention.

FIG. 2 shows, in simplified block diagram form, apparatus suitable for practicing the invention. Referring to FIG. 2, a controller 200 controls test signal acquisition circuitry 210 to acquire data for display. The data is processed and applied to LCD and diver circuitry 220 for display. The test equipment of FIG. 2 also includes a printer interface 250, and a memory device 230. Memory device 230 includes two memory arrays, LCD color Palette 240, a Hardcopy Color Palette 260 and a look-up table 265 for use in converting the LCD data into hardcopy data as described above.

The term "controller" as applied to element 200 is intended to include a "microprocessor", and is also intended to encompass microcomputers, and other forms of controllers such as dedicated hardware controllers including ASICs.

While the invention has been described with respect to a digital oscilloscope, it is herein recognized that it would is also applicable to other types of test and measurement equipment, and such modification is deemed to lie within the scope of the following claims.

What is claimed is:

1. An oscilloscope, comprising:

an input for receiving an analog signal to be measured;

a data acquisition unit for acquiring samples of said analog signal;

a controller coupled to said data acquisition device for receiving digital data therefrom;

a display device, coupled to said controller, for displaying a waveform against a dark background, said waveform exhibiting an apparent intensity; and an output port for coupling data signals to a printer, said data signals being representative of said screen display;

wherein, said controller inverts data signals representative of black and white portions of said screen display and modifies values of data signals representative of color portions of said screen display and provides said inverted black and white data signals and modified color data signals to said printer, and said printer produces a display of color waveforms against a light background in response thereto;

said color waveform retaining the same apparent intensity and hue as said waveform displayed on said display device.

2. The oscilloscope of claim 1 further comprising, a memory device for storing a first color palette for providing color data suitable for display on said display device, a second color palette for providing data suitable for producing output on said printer, and a look-up table;

wherein said data signals representative of said screen display are LCD pixel data, and converting between said LCD pixel data and hardcopy pixel data is accomplished by said controller accessing said look-up table.

3. An electronic test and measurement instrument, comprising:

an input for receiving an analog signal to be measured;

a data acquisition unit for acquiring samples of said analog signal;

a controller coupled to said data acquisition device for receiving digital data therefrom;

a display device, coupled to said controller, for displaying a waveform against a dark background, said waveform exhibiting an apparent intensity; and an output port for coupling data signals to a printer, said data signals being representative of said screen display;

wherein, said controller inverts data signals representative of black and white portions of said screen display and modifies values of data signals representative of color portions of said screen display and provides said inverted black and white data signals and modified color data signals to said printer, and said printer produces a display of a color waveform against a light background in response thereto;

said color waveform retaining the same apparent intensity and hue as said waveform displayed on said display device.

4. The instrument of claim 3 wherein:

a memory device for storing a first color palette for providing color data suitable for display on said display device, a second color palette for providing data suitable for producing output on said printer, and a look-up table;

wherein said data signals representative of said screen display are LCD pixel data, and converting between said LCD pixel data and hardcopy pixel data is accomplished by said controller accessing said look-up table.

5. A method of converting LCD pixel data to color printer data, comprising the steps of:

a) determining if values of red, green and blue color data for a pixel are all non-zero and if so, then subtracting said color values from white, and exiting to step i;

b) determining if only the value of blue is equal to zero, and if so, generating full intensity red and green data signals and reducing blue by an average of the red and green data, and exiting to step i;

c) determining if only the value of green is equal to zero, and if so, generating full intensity red and blue data signals and reducing green by an average of the red and blue data, and exiting to step i;

d) determining if the values of both green and blue are equal to zero, and if so, generating a full intensity red data signal and reducing green and blue intensity by the value of the red intensity, and exiting to step i;

e) determining if only the value of red is equal to zero, and if so, generating full intensity green and blue data signals and reducing red by an average of the green and blue data, and exiting to step i;

f) determining if the values of both red and blue are equal to zero, and if so, generating a full intensity green data signal and reducing red and blue intensity by the value of the green intensity, and exiting to step i;

g) determining if the values of both red and green are equal to zero, and if so, generating a full intensity blue data signal and reducing red and green intensity by the value of the blue intensity, and exiting to step i;

h) determining if the values of red, green, and blue are all equal to zero, and if so, generating a white data signal, and exiting to step i;

i) exit.

* * * * *